United States Patent [19]
McGill

[11] Patent Number: 5,502,387
[45] Date of Patent: Mar. 26, 1996

[54] VARIABLE GEOMETRY MRI COIL

[75] Inventor: Robert E. McGill, Dix Hills, N.Y.

[73] Assignee: Northrop Grumman Corporation, Los Angeles, Calif.

[21] Appl. No.: 294,507

[22] Filed: Aug. 23, 1994

[51] Int. Cl.[6] ................................................ G01R 33/28
[52] U.S. Cl. ......................................... 324/318; 324/322
[58] Field of Search ................................. 324/313, 312, 324/318, 322, 314; 128/653.5, 653.2

[56] References Cited

U.S. PATENT DOCUMENTS

| | | | |
|---|---|---|---|
| 4,095,168 | 6/1978 | Hlauka | 324/318 |
| 4,450,408 | 5/1984 | Tiemann | 324/318 |
| 4,587,493 | 5/1986 | Sepponen | 324/318 |
| 4,752,738 | 6/1988 | Patrick et al. | 324/318 |
| 4,881,034 | 11/1989 | Kaufman et al. | 324/318 |
| 4,973,907 | 11/1990 | Bergman et al. | 324/318 |
| 5,202,634 | 4/1993 | Potthast et al. | 324/318 |
| 5,208,537 | 5/1993 | Rietsch et al. | 324/322 |
| 5,270,656 | 12/1993 | Roberts et al. | 324/318 |
| 5,280,248 | 1/1994 | Zou | 324/318 |
| 5,307,806 | 5/1994 | Jones | 324/318 |
| 5,321,360 | 6/1994 | Mansfield | 324/318 |
| 5,361,764 | 11/1994 | Reynolds et al. | 324/318 |

FOREIGN PATENT DOCUMENTS

| | | |
|---|---|---|
| 4212329 | 8/1992 | Japan . |
| 5076511 | 3/1993 | Japan . |
| 5269108 | 10/1993 | Japan . |

*Primary Examiner*—Sandra L. O'Shea
*Assistant Examiner*—Raymond Y. Mah
*Attorney, Agent, or Firm*—Terry J. Anderson; Karl J. Hoch, Jr.

[57] ABSTRACT

A variable geometry coil system includes a single fixed horizontal coil and a vertically oriented pair of movable coils interconnected through an electronic matrix to allow for a multi-mode system which enables either the vertical pair or the horizontal coil to function alone or to enable a quadrature combination of the coils for optimum signal performance. The vertical coil pair includes two matched coils which are loaded to reduce their tuning sharpness so as to eliminate the need for clinical tuning prior to utilization. Signal losses incurred by the Q reduction are compensated for by including an integrated preamplifier at the signal output.

4 Claims, 2 Drawing Sheets

VARIABLE GEOMETRY MRI COIL

BACKGROUND OF THE INVENTION

1. Field of the Invention

The present invention relates to magnetic resonance imaging (MRI) devices, and more particularly to MRI devices designed to image various human extremities.

2. Description of Related Art

Magnetic resonance imaging (MRI) is a known technique in which an object, animate or inanimate, is placed in a spatially varying magnetic field and subjected to pulses of radiation at a frequency which causes nuclear magnetic resonance in the object, the spectra obtained thereby being combined to form cross-sectional images of the object. The MRI technique is especially useful for medical or veterinary applications because living tissues contain an abundance of hydrogen atoms, whose nuclei resonate at radio frequencies. An MRI apparatus thus operates in general by the application of a radio frequency (RF) field in the presence of other magnetic fields, and the subsequent sensing and analysis of the resulting nuclear magnetic resonances induced in the body.

Any nucleus which possesses a magnetic moment tends to align itself with the direction of the magnetic field in which it is located. Accordingly, when a substance such as human tissue is subjected to a static magnetic field, the individual magnetic moments of the protons in the tissue attempt to align with this polarizing magnetic field. However, the protons precess around the direction of the field at a characteristic angular frequency, know as the Larmor frequency, which is dependent on the strength of the magnetic field and the properties of the specific nuclear species. Once in the polarizing magnetic field, the alignment of the protons exist in one of two possible energy states which describe the spin angular momentum of the protons. Classically, the protons precess, i.e., each proton's axis of rotation generally describes a cone and tends to turn at an angle relative to the direction of the applied polarizing magnetic field. The phases of rotation of the proton are essentially random and a net macroscopic magnetic moment is therefore produced in the direction of the polarizing field, with the randomly oriented magnetic components in the perpendicular or transverse plane cancelling one another.

When the tissue or substance is subjected to an RF radiation pulse which is in the plane transverse to the polarizing magnetic field and which is at or near the Larmor frequency, the net aligned moment is rotated or tipped into the transverse plane to produce a net transverse magnetic moment in the transverse plane at or near the Larmor frequency. The processing protons at this time are no longer random in phase, but rather in a single phase orientation. The degree to which the net magnetic moment is tipped, and hence the magnitude of the net transverse magnetic moment, depends primarily on the duration of time and the magnitude of the applied RF radiation signal.

When the radiation pulse is terminated, the protons realign with the polarizing magnetic field. The resulting changing magnetic moment is measurable, and the magnitude of the radiation emitted by the realigning protons is related to the proton density of the tissue being imaged and its relaxation times (the time necessary for the protons to realign themselves with the polarizing magnetic field), the number of protons in turn being an indicator of the density of the substance (mostly $H_2O$) in the case of humans. The radiation generated by the relaxation of the moments induces a current or electro-motive force (EMF) signal according to Faraday's law in an antenna positioned to enable a series of images of the tissue to be obtained and processed.

Various types of receiving antennas or coils have been designed for MRI applications. The most commonly utilized antenna is the standard sized whole body coil which is dimensioned to be disposed around the entire body of the patient to be imaged, the patient being placed in a tubular member or tunnel which supports the coil and confines the patient during the procedure. This arrangement has several disadvantages. First, due to the standard sizing, a significant void or empty region is defined between the coil and the portion of the patient to be imaged. As the imaged portion of the patient becomes a smaller fraction of the coil's volume, the signal-to-noise ratio decreases, thereby degrading the image quality. Second, the coil receives resonance signals from a significantly larger area than the region of interest, resulting in a sensitivity to extraneous information which degrades the spatial resolution and increases aliasing in the two and three-dimensional Fourier transform methodology used in processing. Third, the configuration of the coil is less than optimal in terms of efficiency or the quality and homogeneity of the RF field generated. Finally, many individuals do not feel comfortable when placed in the tube for extended periods of time, especially those individuals who exhibit claustrophobic tendencies.

SUMMARY OF THE INVENTION

It is accordingly an objective of the present invention to provide an MRI device having an improved signal-to-noise ratio, particularly for obtaining magnetic resonance images of various human extremities such as, but not limited to, the hand, wrist, elbow, knee, ankle and foot, which would be very difficult to image by conventional MRI techniques using a standard sized whole body coil. The design of the MRI device provided by the invention is intended to improve patient comfort during the imaging process by permitting the patient to assume a normal reclining posture while receiving the treatment.

It is a further objective of the invention to provide an MRI imaging coil design with the above advantages, yet which requires only a single coil set for imaging a variety of different patient extremities, thereby providing both economic and logistical advantages for a magnetic resonance imaging center/clinic in reducing the number of coil sets required.

These objectives are achieved by, according to a preferred embodiment of the invention, providing a variable geometry coil system made up of a single fixed horizontal coil and a vertically oriented pair of movable coils which are operator replaceable. The coils are interconnected through an electronic matrix to allow for a multi-mode system. The coil matrixing, selected by the operator, allows for either the vertical pair or the horizontal coil to function alone or to enable a quadrature combination (vertical plus horizontal or horizontal plus vertical) of the coils for optimum signal performance. Advantageously, the coils are loaded to reduce their tuning sharpness (Q factor) so as to eliminate the need for clinical tuning prior to utilization, with any signal loss incurred by the Q reduction being compensated for by an integrated preamplifier.

DETAILED DESCRIPTION OF THE PREFERRED EMBODIMENTS

Figure 1:
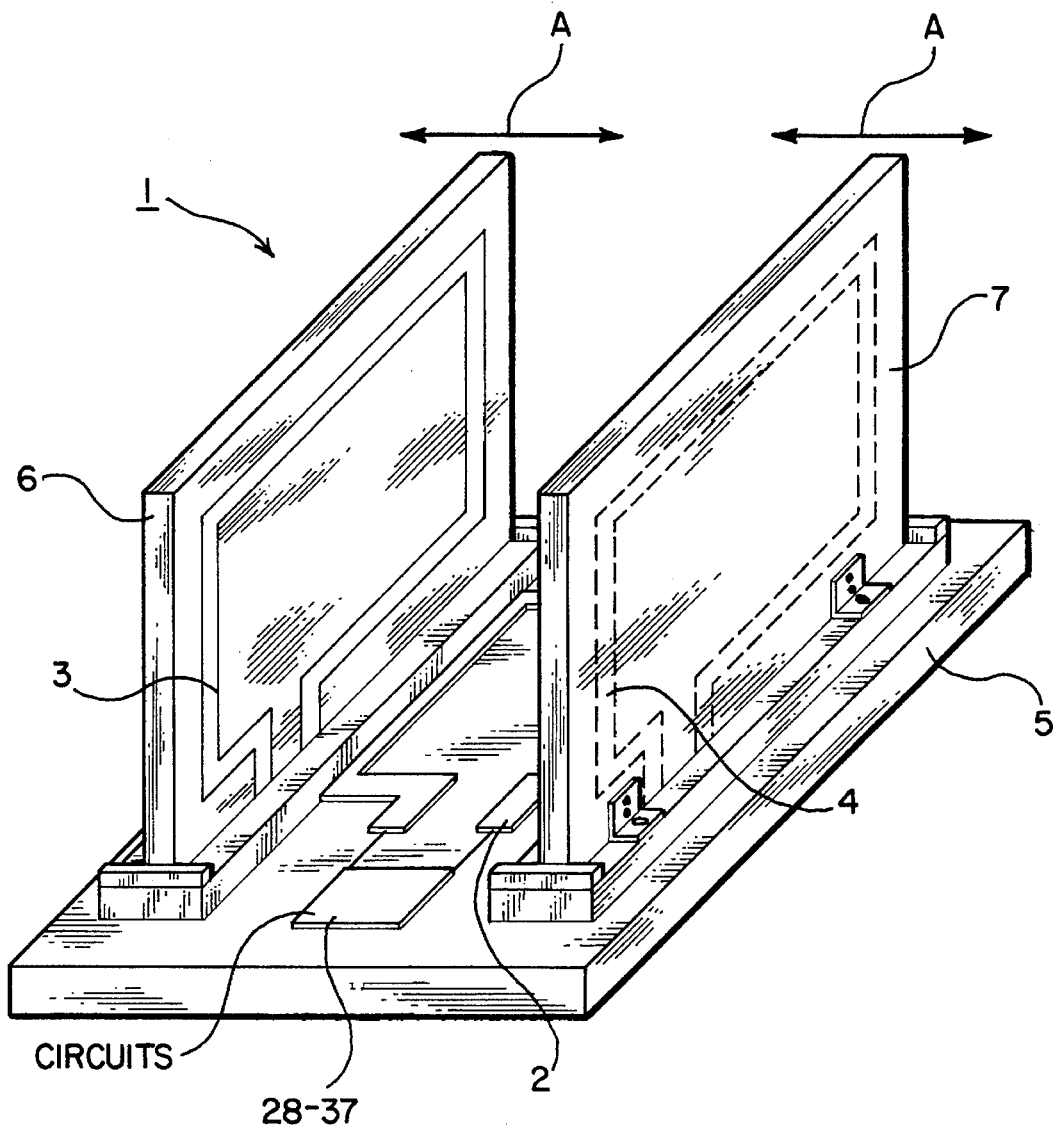
FIG. 1 is a perspective view of a variable geometry MRI coil set constructed according to the principles of a preferred embodiment of the invention.

As shown in FIG. 1, a variable geometry coil set 1 according to a preferred embodiment of the invention includes a stationary horizontal coil 2 and two movable vertically positioned coils 3,4, The vertical coils are movable transversely to a principal axis of the fixed coil, in the direction indicated by arrows A as shown in FIG. 1. This allows the coil set to accommodate different sizes of extremities such as hands, wrists, elbows, knees, ankles, and feet. In use, an extremity is placed over the stationary horizontal coil and between the movable vertical coils, and the vertical coils are adjusted away from or towards each other as indicated by arrows A, as needed, to accommodate the extremity.

The antenna coils are arranged on parallel plates positioned on either side of the anatomical regions of the subject undergoing examination. Although not shown, a cradle assembly similar to the one disclosed in copending application Ser. No. 087,905, now U.S. Pat. No. 5,361,764, issued Nov. 8, 1994 may be used to prevent the subject from moving. Maintaining a parallel orientation between the vertical coils is important so that the resonant signals are not biased by the orientation of the coils. Those skilled in the art will appreciate that while the fixed coil arrangement of the copending application solves many of the problems associated with conventional MRI apparatus, including a low signal-to-noise ratio, degradation of spatial resolution, and increased aliasing, the movable plate configuration described herein further optimizes the solutions provided by the cradle assembly of the copending application, the description of which is herein incorporated by reference.

Figure 2:
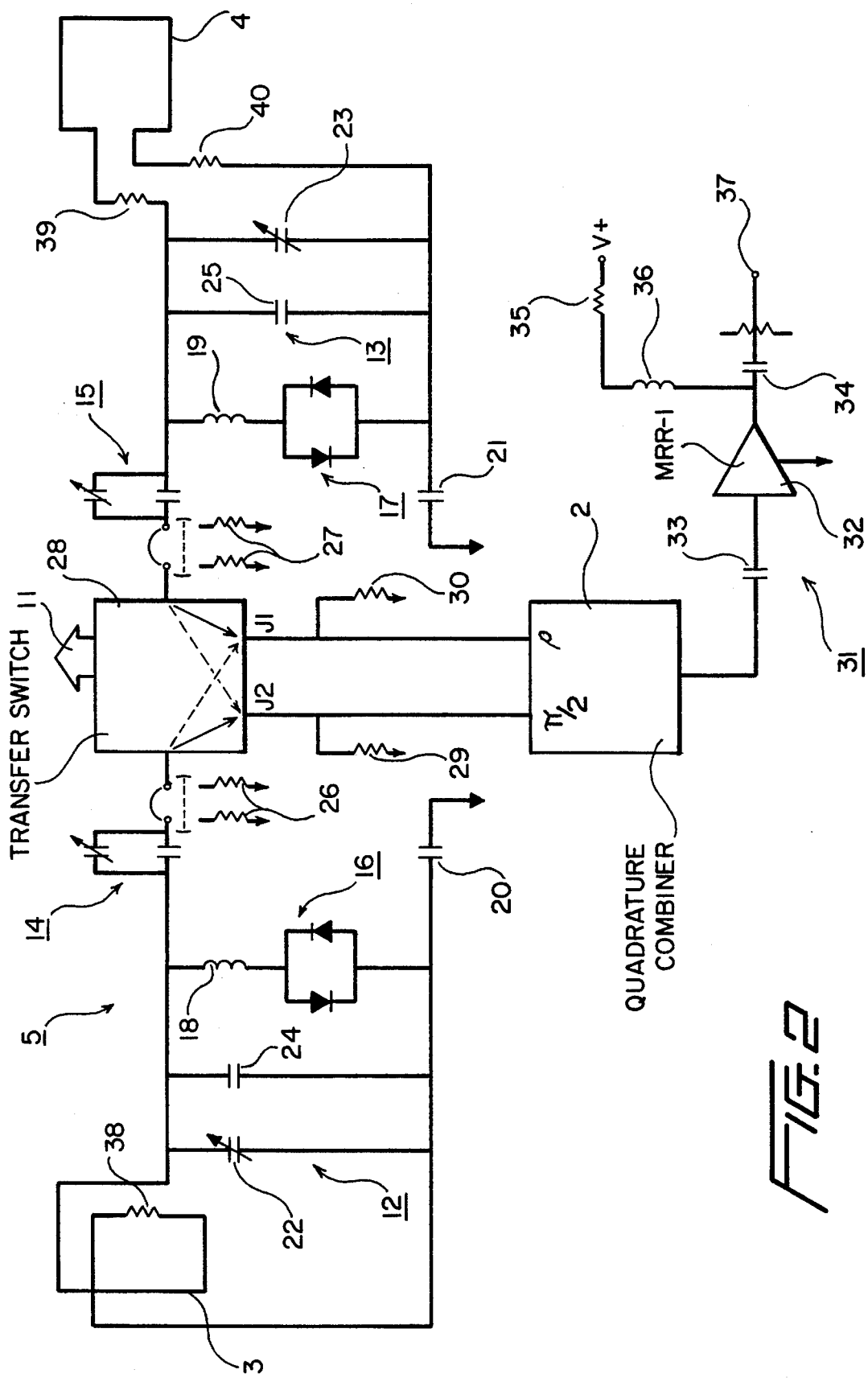
FIG. 2 is a schematic diagram showing a multi-mode signal matrixing circuit for interconnecting the MRI coils shown in FIG. 1.

Tuning and impedance matching of the coils in order to optimize transfer of radio frequency energy from the antenna to a receiver unit (not shown) in a host MRI apparatus is provided by the circuit shown in FIG. 2. The circuit includes all circuit elements necessary for linking the variable geometry magnetic resonance imaging coil system to the host receiver.

The two antenna coils 3,4 are mounted on individual parallel plates 6,7 which have left/right symmetry, but otherwise are identical. The fixed coil 2 and coil matrixing circuitry are mounted on an additional plate 5 which includes a connection port (not shown) for receiving a control bus or cable 1 from the MRI receiver system. Preferably, all circuit elements are fabricated from non-ferrous materials so as not to interfere with the magnetic fields generated by the MRI device.

The antenna coils function in a receive only mode in conjunction with the main MRI RF excitation magnet assembly. Fabrication of the three antenna coils is accomplished by standard techniques well known in the art, such as by fabricating a 0.5 inch copper trace in a rectangular coil configuration by a standard etching process performed on circuit boards which form or are mounted on plates 5,6, and 7, and plating the copper traces with tin to prevent oxidation.

Each tuning/impedance matching network basically includes a shunt capacitor pair 12, 13 for transferring the impedance of the coil to a unit reactance and a series capacitor pair 14,15 for transferring the unit reactance to a predetermined value for transmission to the circuitry on the fixed plate 5, a passive clamping circuit 16,17, an inductor 18,19, and an additional series capacitor 20,21. Each of the capacitor pairs includes a trimming capacitor 22,23 and a fixed capacitor 24,25 connected in parallel. The series and parallel capacitor pairs 12, 14, and 13,15 work in concert with the single capacitor 20,21 to provide the tuning/impedance matching network with the capability of adjusting the resonant frequency and matching the impedance of the network to the transmission line utilized to connect the magnetic resonance imaging receiver system to the MRI device. The transmission line connected to the tuning/ impedance matching network may, for example, utilize standard BNC connectors supporting a 50 ohm characteristic impedance coaxial line 37. The passive clamping circuits include 16,17 for the respective coils each preferably includes a pair of diodes connected in parallel across the network between the shunt capacitor pair and the series capacitor pair to prevent high voltage levels due to induced signals during the MRI excitation phase.

Those skilled in the art will appreciate that the tuning/ impedance matching circuit described so far is designed as a high Q circuit which accordingly has a narrow bandwidth, and therefore is difficult to match and intolerant to component variation. In order to avoid this problem, and thereby avoid the need for clinical tuning each time the coils are adjusted, the Q factor may be lowered by the inclusion, for example, resistors 38,39, and 40. The lower Q circuit provides for greater bandwidth and therefore easier matching, but has a larger transmission loss and thus the advantage of lowering the Q factor must be weighed against the transmission losses and lower signal-to-noise ratio depending on the specific context in which the movable coil set is used.

The system includes an electronic matrix 28 connected to control bus 11 and to quadrature combiner 2 to allow for either the vertical pair or the horizontal coil to function alone or to enable a quadrature combining of the coils for optimal signal performance. When the coils are loaded by the resistors to reduce the tuning sharpness so as to eliminate the need for clinical tuning prior to utilization, an integrated preamplifier signal output circuit 31 including rf amp 32, isolation capacitors 33, 34, and power supply through resistor 35 and inductor 36 may be provided between the signal output 37 and the quadrature combiner 2.

Having thus described in detail a specific preferred embodiment of the invention, it will be appreciated by those skilled in the art that numerous modifications and variations may be made within the scope of the invention. Accordingly, it is intended that the above description and drawing figures not be interpreted as limiting, but rather that they be interpreted solely by reference to the appended claims.

I claim:

1. A magnetic resonance imaging coil set apparatus, comprising:

antenna means for receiving signals representative of nuclear magnetic resonances induced by a radio frequency excitation magnet apparatus, said antenna means comprising at least two antenna coils arranged on first and second parallel plates to be movable relative to each other, and a fixed coil arranged on a fixed plate transverse to the parallel plates;

tuning/impedance matching means mounted on the fixed plate for matching an impedance of said fixed and movable coils with an impedance of a transmission line for transferring radio frequency energy from said antenna means to an MRI receiver;

a multi-mode signal matrixing circuit mounted on the fixed plate, said multi-mode signal matrixing circuit including means for connecting either of the vertical coils separately to a signal output, for connecting said fixed coil separately to said signal output, and for connecting said fixed and movable coils in quadrature to said signal output; and impedance loading means for lowering a Q factor of said tuning/impedence matching means, and a preamplifier mounted on the fixed plate for increasing the signal level to compensate for the signal reduction due to the lower Q factor.

2. Apparatus as claimed in claim 1, wherein each of said impedance matching/tuning circuits comprises shunt capacitors connected in parallel to the movable coils and a transmission line to the matrixing circuit for transforming the impedance of the movable coils to a unit reactance, and series connected capacitances for transforming the unit reactances to a predetermined value for transmission to the matrixing circuit, said shunt capacitors and series connected capacitors each including at least one variable tuning capacitor.

3. Apparatus as claimed in claim 1, wherein said impedance loading means comprises a resistor connected in series with a corresponding coil.

4. Apparatus as claimed in claim 1, wherein said three antenna coils are constructed in a rectangular coil configuration on printed circuit boards.

* * * * *